(12) United States Patent
Näsström et al.

(10) Patent No.: US 7,442,880 B2
(45) Date of Patent: Oct. 28, 2008

(54) CONTACT SPRING ASSEMBLY

(75) Inventors: Kaj Tommy Näsström, Huddinge (SE);
Stig Arvidsson, Österbybruk (SE); Carl Rutger Bladh, Halmstad (SE); Fini Lennart Malmros, deceased, late of Greve (DK); by Annette Malmros, legal representative, Greve (DK)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 83 days.

(21) Appl. No.: 10/381,552

(22) PCT Filed: Apr. 25, 2001

(86) PCT No.: PCT/SE01/00878

§ 371 (c)(1),
(2), (4) Date: Jun. 30, 2006

(87) PCT Pub. No.: WO01/91531

PCT Pub. Date: Nov. 29, 2001

(65) Prior Publication Data

US 2007/0012478 A1    Jan. 18, 2007

(30) Foreign Application Priority Data

May 19, 2000    (SE) .................................. 00018648

(51) Int. Cl.
*H05K 9/00*    (2006.01)

(52) U.S. Cl. ...................................... 174/354; 174/355
(58) Field of Classification Search ................. 174/354, 174/355, 366, 369; 361/816, 818, 800; 277/920; 29/592.1
See application file for complete search history.

(56) References Cited

U.S. PATENT DOCUMENTS

| | | | | |
|---|---|---|---|---|
| 3,904,810 A * | 9/1975 | Kraus | ..................... | 174/354 |
| 4,623,752 A * | 11/1986 | Steen et al. | ................. | 277/637 |
| 5,001,297 A * | 3/1991 | Peregrim et al. | ............ | 174/354 |
| 5,004,866 A * | 4/1991 | Cooke et al. | ................ | 174/366 |
| 5,138,529 A * | 8/1992 | Colton et al. | ............... | 361/816 |
| 5,545,843 A * | 8/1996 | Arvidsson et al. | ........... | 174/355 |
| 6,000,956 A * | 12/1999 | Henningsson et al. | ......... | 439/95 |
| 6,051,781 A * | 4/2000 | Bianca et al. | ............... | 174/351 |
| 6,201,182 B1 * | 3/2001 | Sosnowski | ................... | 174/369 |
| 6,225,555 B1 * | 5/2001 | Sosnowski | ................... | 174/355 |
| 6,744,641 B2 * | 6/2004 | Schnabel | .................... | 361/818 |

* cited by examiner

*Primary Examiner*—Hung V Ngo

(57) ABSTRACT

The present invention relates to a method of securing a reliable electrical contact between two adjacent surfaces by means of a contact spring (30) of a contact spring assembly (1). The secure and reliable contact is achieved by providing excellent conditions for maintaining the contact spring fully operable at all times and is accomplished by providing a shelter (12) for the contact spring (30) on a carrier (10) therefore, thereby protecting the contact spring by eliminating the possibility of the contact spring being overloaded and plastically deformed during installation.

25 Claims, 7 Drawing Sheets

CONTACT SPRING ASSEMBLY

TECHNICAL FIELD

The present invention relates generally to the grounding and/or shielding of electronic equipment and specifically relates to a contact spring assembly for grounding and/or shielding components such as modules; members carrying electronic components, such as printed circuit boards; or casings enclosing such members and/or components.

BACKGROUND

For most electronic equipment, and not least for electronic equipment employed in tele-communication systems, it is essential to provide an effective shield or screen with regard to electromagnetic radiation that may disturb and interfere with the operation of other electronic equipment. In order to prevent electromagnetic coupling (EMC) between electronic components it is therefore equally important to block out ambient electromagnetic radiation on the one hand and to shield against the emission of radiation on the other hand. Such a shielding may be provided for individual components as well as for PCB's carrying such components, board fronts and entire casings, such as magazines, enclosing such electronic equipment. The most common way of providing such a shield for all of the above mentioned applications is by way of a contact spring that with a base portion is fixed to a first surface of a component, a PCB, a board front or a casing and that contacts an opposite surface with contact spring tongues extending from the base. The same general type of contact spring is also frequently used for grounding purposes, whether for preventing harmful electrostatic discharge between electronic equipment or for earth-connecting an electronic component, that is creating a zero potential for said equipment or component.

In all of said applications it is vital for the contact spring to make good contact between the two surfaces and to securely maintain such contact even when a component or casing wall etc. is dismounted and reassembled one or several times. The attachment of the contact spring to the surface in question must also be secure so as to avoid that the contact spring itself falls off said surface and interferes with other components of the equipment.

However, none of the contact spring presented so far have been able to solve all of the above-discussed problems to a satisfactory degree. A common design for such contact springs is to provide a clamp portion through which the contact spring is attached to the relevant surface either by being pushed over one edge thereof or by being inserted into apertures formed in said surface. None of these suggestions provides a definite solution to the problems of maintaining a secure contact and of fixing the contact spring to the surface, since only one longitudinal side thereof is attached to the surface. The other side providing the spring action may be easily deformed so that contact is no longer guaranteed for all contact tongues or may even get caught in some object so that the entire spring is torn off from the surface. This may even happen before the component is finally mounted if a spring tongue gets caught for instance in the clothes of an installer. The forming of apertures for the clamp portions is a bad solution since even a small aperture in many cases deteriorates the shielding.

Specifically for the purpose of grounding adjacent board fronts in a magazine or other casing there is also the requirement that the attachment shall not interfere unacceptably with the standardized inner space of the normally U-shaped front. The reason for this latter requirement is the ever-increasing thickness of the employed PCB's, more and more commonly requiring the full available space of the board front. One approach to provide an attachment that does not interfere with said inner space is to attach one longitudinal side of the contact spring to the outer side surface of the board front by means of an adhesive. Although this solution requires no inner space it involves great efforts of cleaning the surfaces of both the board front and the contact spring before adhesion, and yet does not at all times prevent the contact spring from falling off during insertion of the respective board front.

A further approach to provide an appropriate contact spring for the above purposes is to employ an assembly consisting of a substantially flat elongated carrier plate that is attached to the respective surface by riveting and on which a contact spring is supported. Examples of such solutions are disclosed in U.S. Pat. Nos. 4,623,752 and 5,001,297. The two longitudinal edges of the contact spring are bent inwardly towards each other and extend below the carrier whereas the spring tongues span the carrier transversally. In this assembly the spring portion may be deformed completely until it engages the upper side of the carrier. Not only does this involve risks of permanent deformation of the spring by overloading, the full compression of the spring may also cause the spring to be disengaged from the carrier. In situations where an object such as a wall section is inserted incorrectly, such a design involves a great danger of the contact spring, or at least spring elements thereof, being completely cut-off by shearing action. The conventional attachment, such as by riveting, also takes up valuable space on the inner side of said surface and requires the use of tools.

SUMMARY

The invention overcomes the above problems in an efficient and satisfactory manner.

A general object of the invention is to the problem of providing an effective shielding and/or grounding of electronic equipment.

In particular, it is an object of the invention to provide an improved method of securing a reliable electrical contact between two adjacent surfaces by means of a contact spring of a contact spring assembly. Briefly, the secure and reliable contact is achieved by providing excellent conditions for maintaining the contact spring fully operable at all times. Specifically, this is accomplished by providing a shelter for the contact spring on a carrier therefore, thereby protecting the contact spring by eliminating the possibility of the contact spring being overloaded and plastically deformed or even cut-off by shearing forces applied by an adjacent surface during installation.

In accordance with an embodiment of the invention an effective protection from plastic contact spring deformation or overloading is achieved in particular by providing a contact spring assembly having a carrier for attachment to one of two opposite surfaces of electronic equipment and a contact spring supported by the carrier for making electrical contact with both said surfaces. Briefly the invention suggests providing sheltering pockets in the upper side of the carrier for the individual spring elements of the contact spring. In other words, when the contact spring experiences a load that would normally tend to produce plastic deformation thereof, the sheltering pockets will receive their associated spring elements and will protect them from further load. The carrier will itself take up such excessive load, in the areas thereof surrounding the pockets.

In a further embodiment of the invention the sheltering pockets are extended around the longitudinal edges of the carrier, thereby specifically offering protection to the contact spring against the shearing action from adjacent surfaces during installation.

In a further embodiment the longitudinal side edges of the contact spring are received and thus sheltered in the extended pockets in the installed, unloaded condition. Thereby, the contact spring is securely retained in the correct position on the carrier, with the spring members aligned with their associated pocket.

The correct positioning of the contact spring on the carrier is enhanced even further by providing guides on the side edges of at least one extended sheltering pocket of the carrier, said guides fitting snugly to the sides of the associated spring element at the longitudinal side edges.

In yet another embodiment of the invention the pockets are formed by providing mutually spaced transversal lands on the upper side of the carrier. Such a configuration lends itself well to forming the carrier from a sheet material in which transversal openings are cut out forming the pockets when the longitudinal edges of the sheet material are folded downwardly and inwardly towards each other. In such a configuration the remaining portions of the sheet material between the openings form the upper lands of the carrier, protecting the spring elements by taking up the excessive forces.

Another object of the invention is to provide an improved and very effective contact spring assembly for shielding and grounding purposes, presenting a solution to the problem of providing a secure and reliable contact between two surfaces.

A further object of the invention is to provide an improved carrier for a contact spring assembly.

Yet another object of the invention is to provide an improved method of forming a carrier for a contact spring assembly.

These and further objects of the invention are met by the invention as defined in the appended patent claims.

A second aspect of the invention relates to a method of attaching a contact spring assembly and specifically the carrier thereof, to a surface electronic equipment. Briefly, the invention suggests providing attachment means on the underside of the carrier, that is the side facing such a surface in the attached condition.

In a preferred embodiment the attachment means each consist of a pair of spaced resiliently yielding attachment tabs cooperating with a slit formed in the underlying electronic equipment surface to form a sort of snap-in attachment with the equipment surface. In this manner the contact spring assembly may be attached as a complete unit without the need for any specific tools for fastening means or adhesives.

In a further embodiment of this second aspect specifically applicable in situations where the available space on the inner side of a wall or panel of the electronic equipment is restricted, a recess is formed on the inner side of said wall, the slit being formed through a bottom surface of the recess. With an appropriate dimensioning of the recess and the attachment tabs this approach permits the secure attachment of the contact spring assembly without interfering with the space on the inner side of said wall or panel.

This second aspect of the invention is specifically applicable to contact spring assemblies employed for shielding PCB board fronts where the inner space of the board front is becoming more and more restricted.

In summary, the present invention provides the following advantages over the state of the art:

The contact spring maintains an effective electrical contact at all times;

The risk of the contact spring collapsing or being plastically deformed is eliminated;

The contact spring will not come loose from its attachment;

Shearing forces will not be applied to the contact spring during installation;

The contact spring is secured in an appropriate position relative to the carrier;

The attachment requires minimum space;

No need for tools or specific means to attach the contact spring assembly;

Other advantages offered by the present invention will be readily appreciated upon reading the below detailed description of embodiments of the invention.

BRIEF DESCRIPTION OF THE DRAWINGS

The invention, together with further objects and advantages thereof, may best be understood by making reference to the following description taken together with the accompanying drawings, in which.

FIB. 2B is a cross section through the contact spring illustrated in FIG. 2A, along the line A-A.

DETAILED DESCRIPTION

The invention will be described below with reference to drawing FIGS. 1-7 that illustrate embodiments thereof adapted for use in combination with PCB board fronts to provide shielding and/or grounding thereof. However, it shall be understood that the invention is not restricted to these exemplifying embodiments or to such an application. The basic principles of the invention may likewise be applied for shielding and/or grounding purpose in association with other electronic equipment, such as mentioned above. Therefore, modifications and variations of the invention that may be required in such applications fall within the scope of the invention.

Figures 1A, 1B:
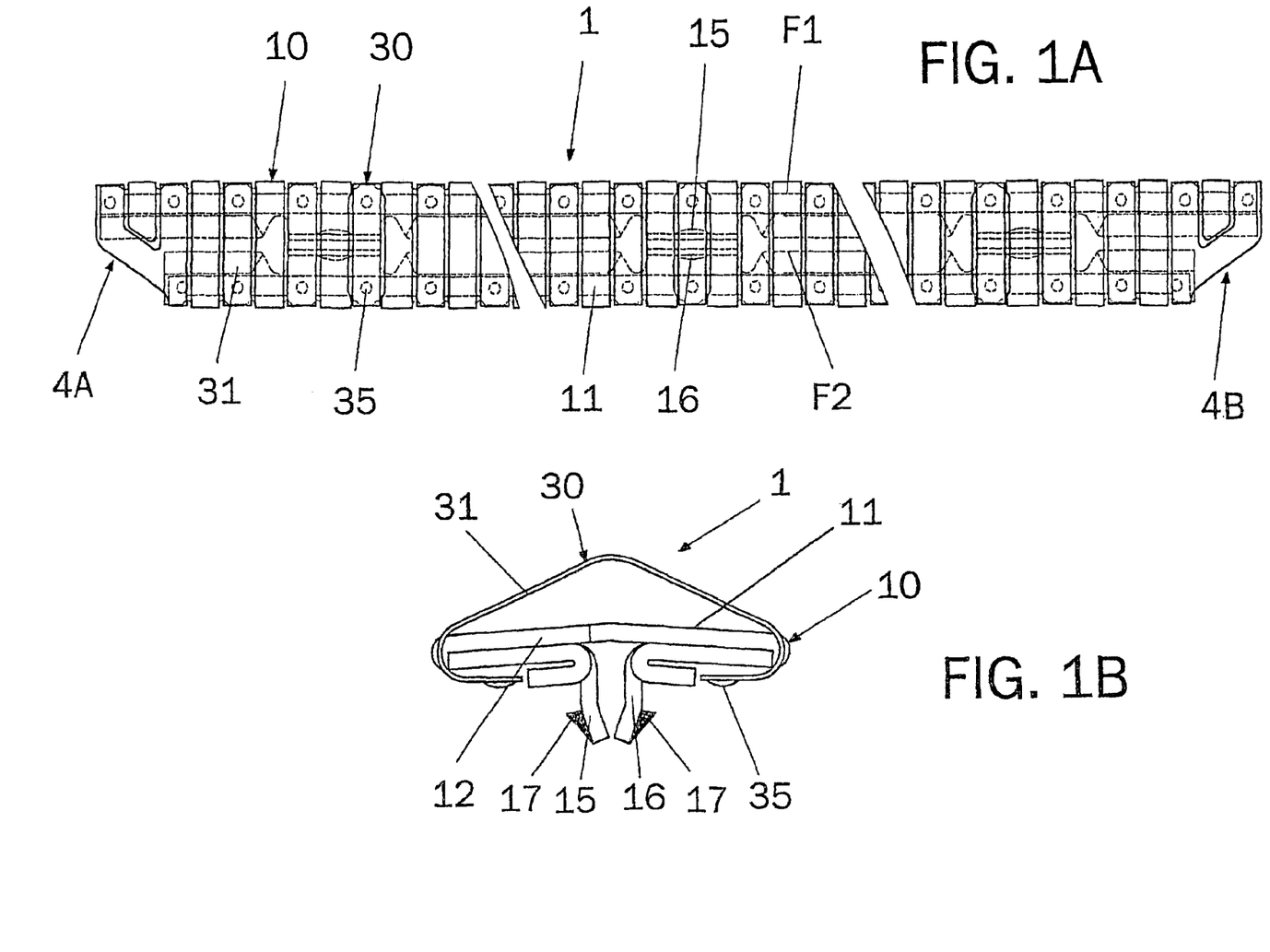
FIGS. 1A-B are top plan and end views respectively of a complete contact spring assembly according to the invention, consisting of a contact spring and a carrier.
Figure 7A:
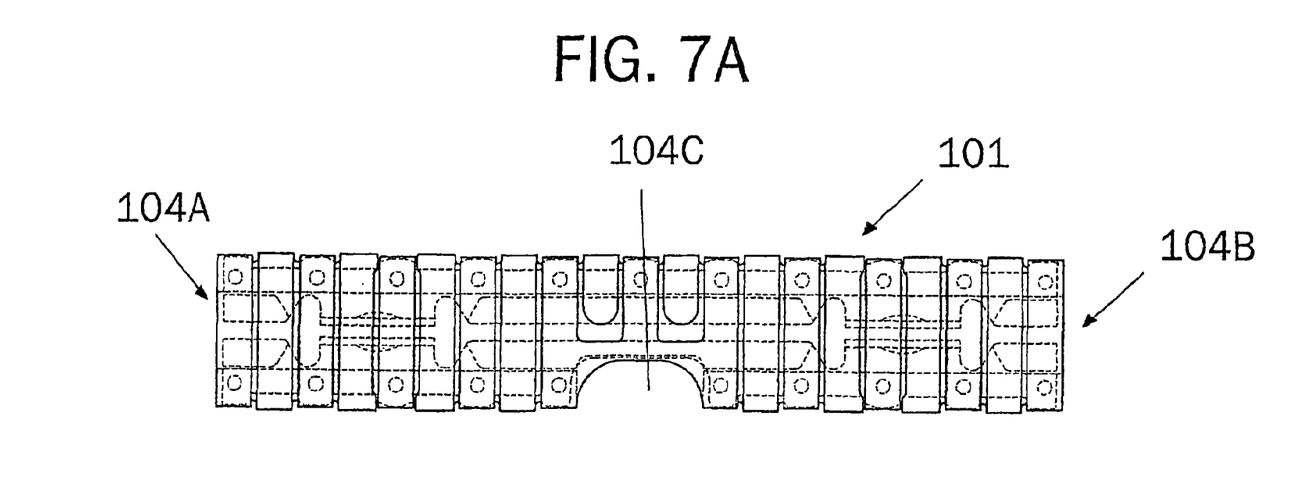
FIG. 7A is a top plan view of a complete supplementary contact spring assembly according to the invention, likewise consisting of a contact spring and a carrier.

Referring now to the drawings, and more particularly to FIGS. 1A-B, there is shown a contact spring assembly of the present invention, in this embodiment comprising a main assembly generally designated by 1 and intended for use with a supplementary assembly illustrated in FIG. 7A and generally designated by 101. Such a divided contact spring assembly will many times be advantageous or even required in association with a board front in order to provide access to or space for fasteners etc. employed on the board front for various purposes. The illustrated end portions 4A, 4B of the assembly 1 are configured for such purposes. Notwithstanding the above, the invention likewise covers producing the assembly in variable lengths or even in long length to be cut up in the appropriate lengths necessary for a specific application. Likewise the end portions may be designed otherwise for different applications.

The contact spring assembly 1 of FIGS. 1A-B is comprised generally of a contact spring carrier 10 supporting a contact spring 30 in position thereon. The contact spring 30 of the assembly 1 is illustrated in detail in FIGS. 2A-B and has individual spring elements 31 provided side by side and evenly distributed along the length of the assembly 1. The spring elements 31 are separated by interspaces 32. The spring elements 31 are extended transversally to the longitudinal direction of the assembly 1. At each end the spring elements 31 are fixed to the respective longitudinal side edge portion 33A, 33B of the spring 30.

Figure 2A:
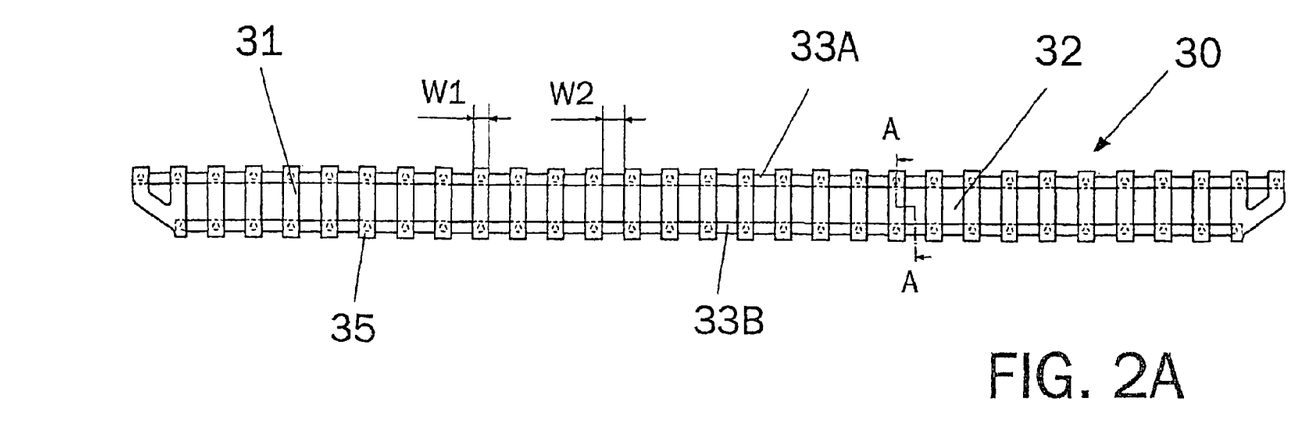
FIG. 2A is a top plan view of a contact spring of the assembly illustrated in FIGS. 1A-B.
Figure 2B:
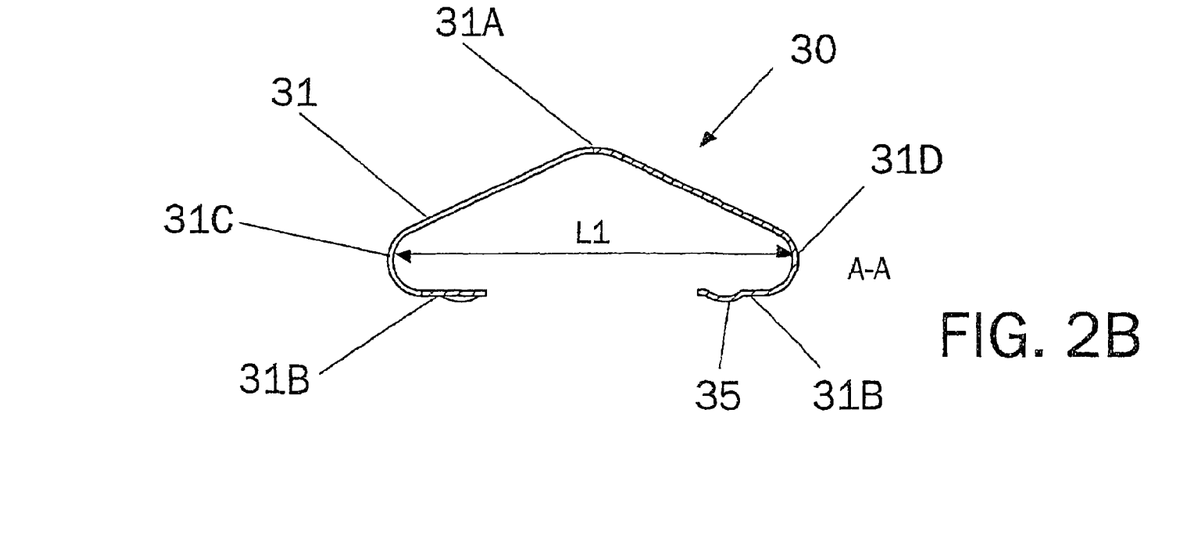

With specific reference to FIG. 2B it is illustrated that the spring elements 31 are each formed with a central portion 31A having an inverted V-shape. This central portion 31A forms an upper contact area for engagement with one of two surfaces 2A, 3A (see FIGS. 4A and 4B) of the electronic equipment to be shielded. The longitudinal edge portions 33A, 33B of the spring 30 are bent downwardly and inwardly towards each other forming lower contact areas 31B for engagement with the other of said two surfaces 2A, 3A. In order to enhance the contact in this area the lower contact areas 31B are each provided with a number of contact bosses 35.

Between the upper central portion 31A and the lower edge portions 31A, 31B of the spring 30 are formed rounded side portions 31C, 31D, the purpose of which will be clarified below. In this connection it should be noted that the interspaces 32 and thereby the spring elements 31 extend around the side portions 31C, 31D and a short distance into the lower contact areas 31B.

The contact spring 30 is preferably manufactured from a sheet material, such as thin steel plate, having a good electric conductivity and offering the appropriate spring characteristics. Such materials are known in the art and will therefore not be specified herein. Likewise the material is normally provided with a conventional surface coating, such as of tin, copper or even silver or gold, protecting it from environmental influence. A presently preferred method of manufacturing the contact spring of FIGS. 2A-B from a contact spring blank 30BL will be described further below, with reference to FIGS. 5A-B.

Figure 3A:
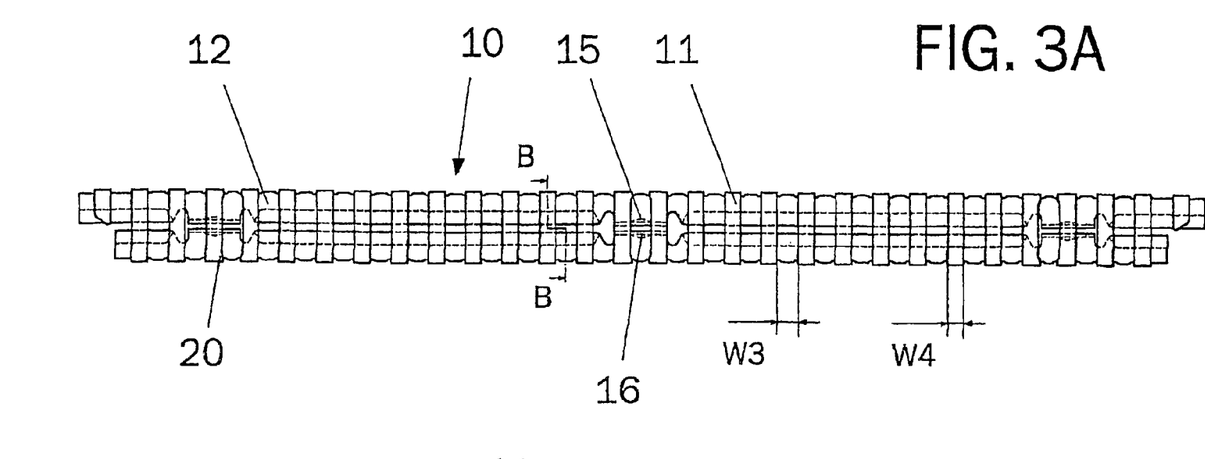
FIG. 3A is a top plan view of a contact spring carrier of the assembly illustrated in FIGS. 1A-B.
Figure 3B:
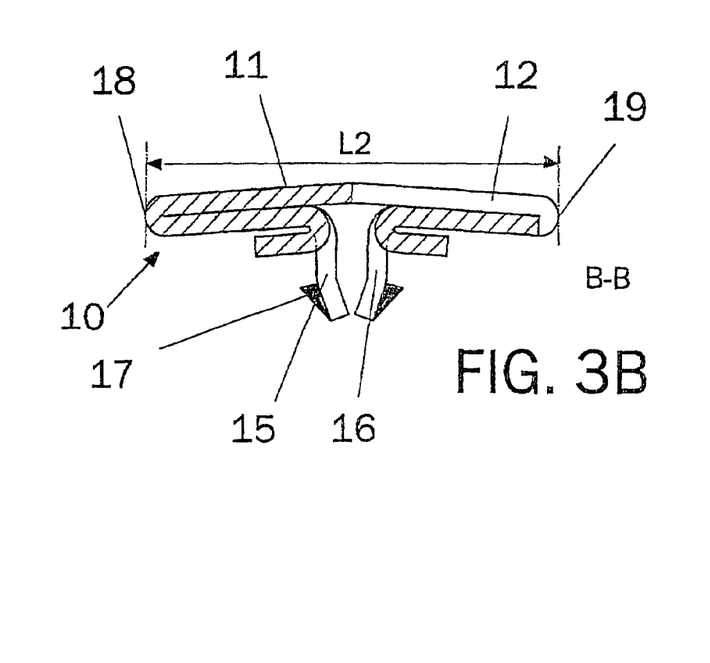
FIG. 3B is a cross section through the contact spring carrier illustrated in FIG. 3A, along the line B-B.
Figure 4A:
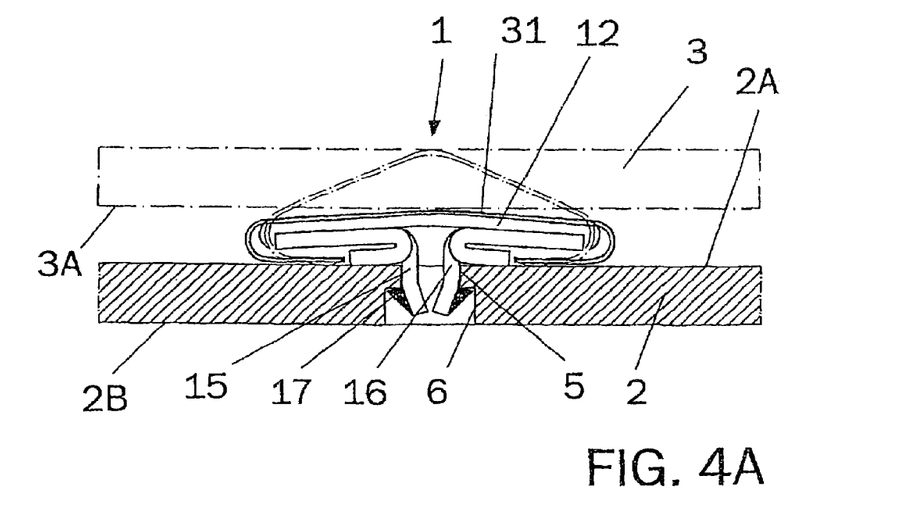
FIGS. 4A-B are partially sectioned end views of a complete contact spring assembly according to the invention attached to a surface, illustrating two different load conditions that may be encountered during use.
Figure 4B:
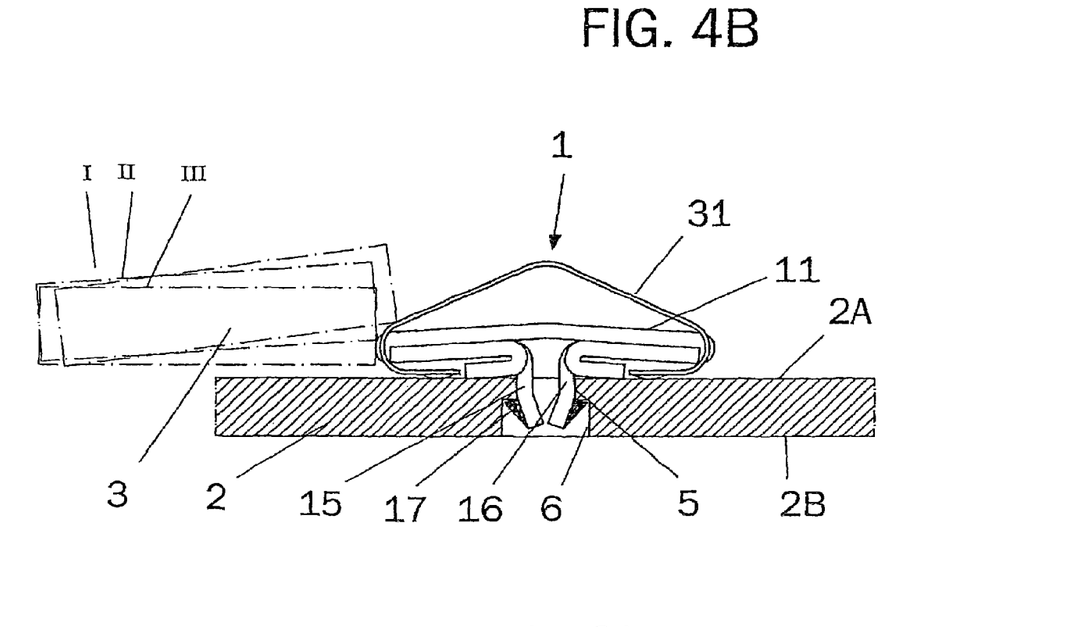

In the assembly 1 the described contact spring 30 is supported on a contact spring carrier 10 illustrated in detail in FIGS. 3A-B. The carrier 10 has an elongate, generally rectangular shape and is formed on its upper side—referring both to the illustration in FIG. 3B and to its position relative to the associated electronic equipment surface 2A, as illustrated in FIGS. 4A-B—with raised portions 11 in the form of lands extending transversally to the longitudinal direction of the carrier 10. Between the lands 11 are formed recessed portions forming sheltering pockets 12. In the assembled condition the spring elements 31 are aligned with an associated sheltering pocket 12, whereas the interspaces 32 between the spring elements 31 are aligned with an associated land 11.

The depth of the sheltering pockets 12 exceeds the thickness of the spring elements 31, and the width W3 of the sheltering pockets 12 clearly exceeds the width W1 of the individual spring elements 31. Similarly the width W2 of the interspaces 32 between the spring members exceeds the width W4 of the lands 11. By virtue of the above described configuration it is clear that the spring members 31 can be received and sheltered in the pockets 12. Accordingly, in situations where the contact spring 30 is subjected to excessive load the individual spring elements 31 are deflected down into the pockets 12 so that the lands 11 extending up through the interspaces 32 take up the excessive load. Such an overload situation is represented with solid lines in FIG. 4A that illustrates the case where a spring element 31—its unloaded condition illustrated with dash dot lines—is pressed down into a pocket 12 by an opposite surface 3A. Said drawing FIG. 4A also serves to illustrate that the spring assembly 1 may be assembled compressing the contact spring 30 so that the carrier 10 may be inserted therein from one side.

The lands 11 and thus the sheltering pockets 12 are extended around the longitudinal side edges 18, 19 of the carrier 10 (FIG. 3B) so that, in their unloaded condition the rounded side portions 31C, 31D of the spring elements 31 are accommodated in the extended portions of the pockets 12. Specifically the spring 30 is formed having a width L1 between the rounded side portions 31C, 31D being clearly smaller than the width L2 of the carrier 10 as measured between the side edges 18, 19.

The purpose of this configuration is primarily to correctly position the spring 30 relative to the carrier 10. As was mentioned above the pockets 12 are made clearly wider than the spring elements 31 to secure free movement of the spring elements 31 into the pockets and thereby to secure protection of the spring 30 in overload situations. However, it is essential that the spring 30 and the carrier 10 be retained in correct position relative to each other. This is achieved by providing guides 20 (illustrated in detail in FIG. 6B at the side surfaces of one or more pockets 12', in the area of the extended portions of the pockets 12'. Said guides 20 will engage and position the respective spring element 31, thereby also stabilizing the complete contact spring 30 relative to the carrier 10.

On the other hand the extended pockets 12 also serve to protect the spring 30 against shearing forces. Such shearing action may otherwise easily be the result when a board-front wall 3 (schematically represented in FIG. 4B), or alternatively a component or casing wall, a panel etc, is forcibly inserted in a displaced or inclined position against an already installed board-front wall 2. In the worst case this may cause the contact spring 30 or individual elements 31 thereof being completely cut off. This risk will be eliminated by the invention, by virtue of the fact that the contact spring elements 31 will be sheltered in the pockets 12 also at the longitudinal side edges 18, 19 of the carrier 10. In this manner, the carrier lands 11 surrounding the pockets 12 in the extended portions thereof will take up the shearing forces and will rather apply a moment to the wall 3 of the board-front being installed.

This situation is illustrated in FIG. 4B that does not claim to be a true illustration of a pair of adjacent board fronts but schematically illustrates wall portions 2, 3 thereof, with the intention of clarifying the principles of the described function. The applied moment in turn tends to straighten up the board front wall 3 from the original position I, through position II and to position III, from which the appropriate installation will proceed. The described automatic straightening up of the board-front wall 3 being installed, has the further advantageous effect that the edges thereof will not scratch off any surface coating from the spring material. This is of great importance since such surface coating material must not be allowed to fall down to the sensible electronic components.

The carrier 10 and thereby the complete spring assembly 1 are intended to be attached to a surface, such as the outer surface 2A of the board-front wall 2 illustrated in FIGS. 4A-4B, through attachment means 15, 16. In the illustrated embodiment the attachment means comprise an optional number of pairs of attachment tabs 15, 16 provided on the underside of the carrier 10. The tabs 15, 16 of each pair are provided at a small distance from each other. The number of pairs of attachment tabs and their positions may on the other hand be chosen as required by the specific application.

The free ends of these tabs 15, 16 may be resiliently brought together during insertion into a slit 5 formed in the board-front wall 2. To facilitate insertion into the slit 5 the tabs 15, 16 are bent slightly inwardly towards each other at their free outer ends, thereby forming a sort of insertion taper. Each attachment tab is preferably formed having a locking lug 17 on its outer surface facing away from the other tab of each pair, thereby providing a positive fixing of the assembly in position as the locking lugs 17 pass through the slit 5 and the tabs 15, 16 are relieved and spring back.

An extremely space saving or even completely hidden attachment is accomplished in accordance with the invention as illustrated in FIGS. 4A-B. A recess 6 is formed in the board-front wall 2, from the inner surface 2B thereof facing away from the attached assembly 1. The slit 5 is then formed through the bottom of the recess 6. With the illustrated dimensioning of the depth of the recess 6 and the length of the tabs 15, 16, the latter will, in their locked position, end inside the recess. In this manner the attachment does not interfere with the inner space, which is extremely advantageous in applications for board fronts, for the reasons discussed in the introduction.

Figure 5A:
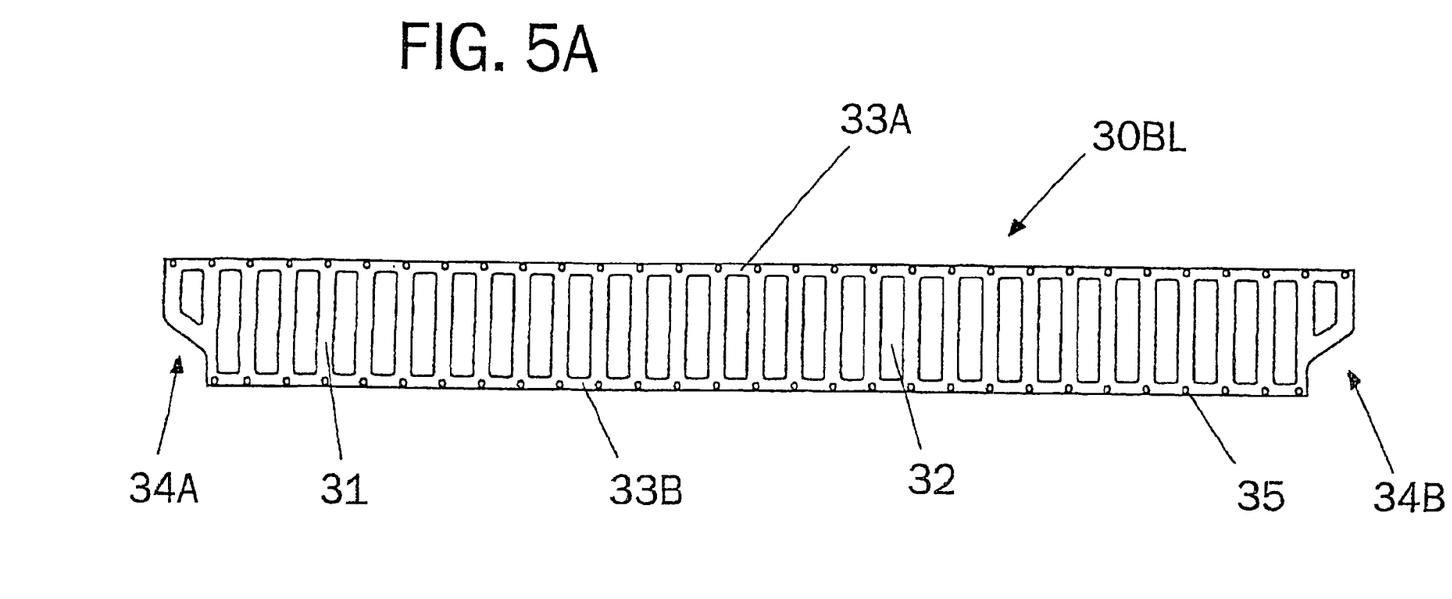
FIGS. 5A-B are top plan and end views respectively of an embodiment of a contact spring blank for forming a contact spring of the assembly according to the invention.
Figure 5B:
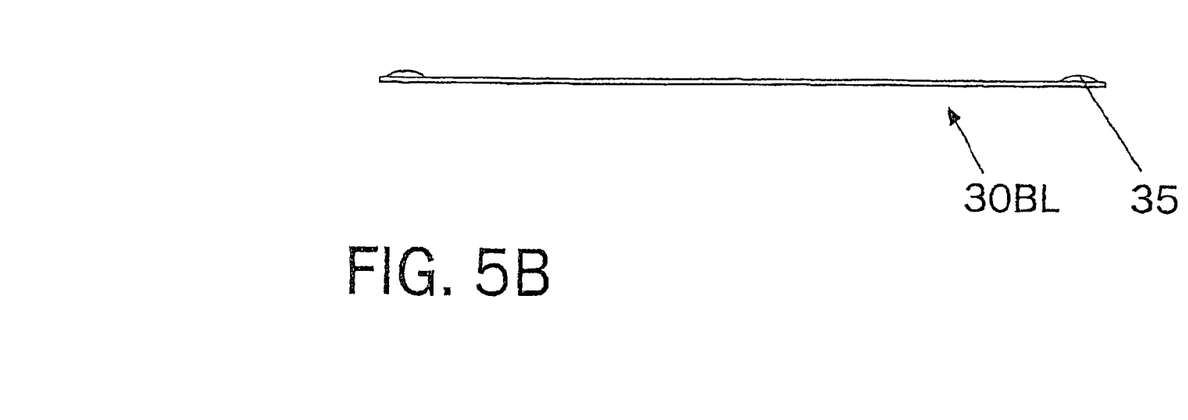

Referring now specifically to the embodiment of FIGS. 5A-B the contact spring 30 according to the invention is formed from a sheet material spring blank 30BL, preferably of steel. The blank 30BL is manufactured by punching a series of apertures 32 in the sheet material. Said apertures and the sheet material bands separating the apertures form the interspaces 32 and the spring elements 31 respectively, of the completed spring 30. The sheet material portions left outside each end of the apertures from the side edge portions 33A, 33B of the spring 30. The end portions 34A and 34B as well as each contact boss 35 are preferably formed in the same punching operation. Subsequently the spring 30 is given its final shape, as illustrated in FIG. 2A, in a bending operation, in which is formed the inverted V-shape with the first contact area 31A of the spring elements 31 as well as the downwardly, inwardly bent edge portions 33A-B. The latter form the lower contact areas 31B of the spring and are connected to the spring elements 31 through the curved side portions 31C, 31D.

A presently preferred method of producing the contact spring carrier 10 of the invention will now be described with specific reference to FIGS. 6A-C that illustrate a sheet metal blank 10BL for forming the carrier 10. The thickness of the sheet material is chosen mainly to provide the appropriate strength properties for the carrier to safely perform its supporting function, but also to be clearly greater than the thickness of the spring material bland 30BL, for reasons that will become apparent.

An optional number of evenly spaced apertures 12, 12' are punched in the generally rectangular bland 10BL. These apertures will form the sheltering pockets 12, 12' of the finished carrier 10 and the blank material remaining between the apertures 12 will form the lands 11 of the carrier 10. As was mentioned above, one or more of the apertures 12' are formed having inwardly protruding guides 20 formed at end portions of the respective side surfaces of the aperture. This is illustrated in detail in FIG. 6B whereas FIG. 6C illustrates a standard aperture 12.

End configurations 14A, 14B are formed in the same punching operation, as well as a number of tabs 15, 16 formed at regular intervals along each longitudinal side edge portions 13A, 13B respectively. A slit 17A is formed in each tab 15, 16 so that an essentially central portion 17 of each tab 15, 16 may be pressed outwardly forming a locking lug 17 of a generally arcuate shape. The side edge portions 13A, 13B of the blank 10BL are then bent or folded downwardly and inwardly towards each other along a first folding line F1 indicated in FIG. 6A. Through this first bend or fold the side edge portions 13A, 13B will be positioned generally underneath the apertures. The outer side edge portion is then folded back upwardly and outwardly, except for the tabs 15, 16 that are only bent down to be extended approximately normal to the underside of the carrier 10. This final bending or folding is carried out along a second folding line F2.

The "double folding or bending" of the punched carrier blank 10BL provides a comparatively simple and economical method of forming a carrier 10 in one piece, having the appropriate properties. The first "fold" F1 forms the pockets 12 and the lands 11, whereas the second "fold" forms the attachment tabs 15, 16 and provides a further "backing" of the carrier 10, providing the necessary strength for supporting the spring 30 and for a secure attachment of the assembly 1.

Figure 7B:
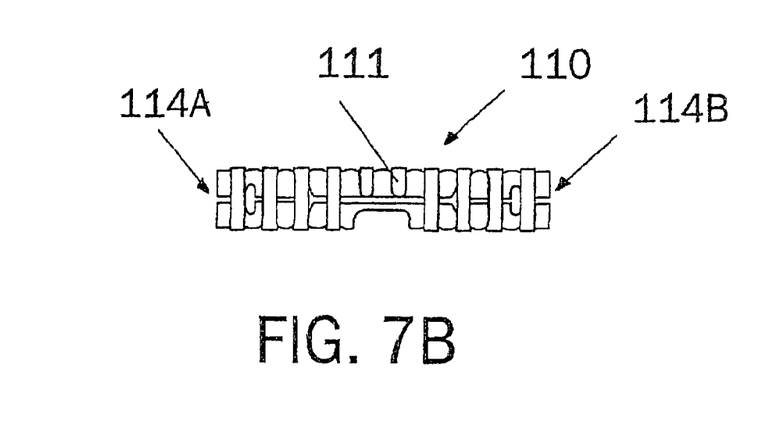
FIG. 7B is a top plan view of a supplementary section of a contact spring carrier for use in the supplementary assembly of FIG. 7A.
Figure 7C:
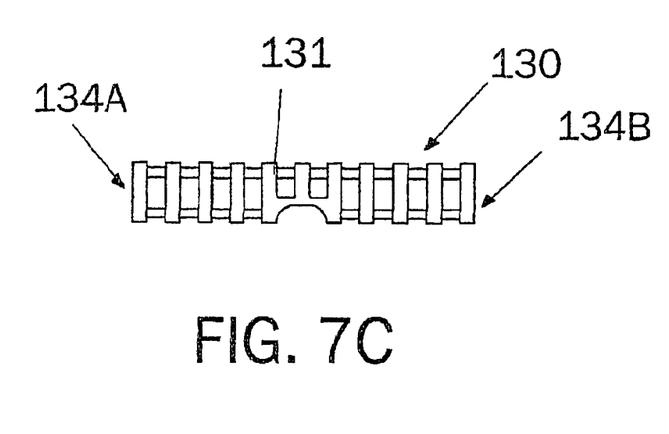
FIG. 7C is a top plan view of a supplementary section of a contact spring for use in the supplementary contact spring assembly of FIG. 7A.

FIGS. 7A-C illustrate the supplementary contact spring assembly 101, a supplementary carrier 110 and a supplementary contact spring 130 respectively, that in the illustrated embodiment are used as a separate unit joining two adjacent main assemblies 1. This supplementary assembly 101 and its part have the same general structure as the main assembly 1 and its parts. However, the supplementary assembly 101 and its carrier and spring are illustrated having straight edges 104A, 104B; 114A, 114B and 134A, 134B respectively, cooperating with the profiled ends 4A, 4B of the main assemblies 1. As mentioned above said end configurations may be modified depending upon the requirements of specific applications. Moreover, the supplementary assembly 101 is provided with a cutout 104C along one of its side edges, said cutout providing space for a fastener etc. on the board front that has to be accessible with the spring assembly attached. In this case the adjacent carrier lands 111 are shortened so that they only extend approximately halfway across the carrier 110 and thus provide space for a specific spring element 131 configuration having a general E-shape. This provides for an uninterrupted spring action along the full length of the supplementary assembly 101, in spite of the provision of the cutout 104C.

Although the carrier 10 has been described herein with reference to a specific embodiment thereof formed from a sheet material blank, it shall be emphasized that the invention is not restricted to such a design. Since the carrier does not participate in the actual shielding or grounding it is not required having specific electrical properties but strength properties to provide an adequately secure and stable support for the spring and a secure attachment for the assembly. Therefore, the invention likewise covers forming the carrier by alternative methods and from different materials, such as by injection molding of a suitable plastic material or casting of metals etc.

Likewise, the invention shall not be restricted to the use of the illustrated attachment lugs forming the snap-in attachment, but shall also cover the use of other kinds of attachment means that are in themselves known within similar and other areas. This includes forming single tabs on the carrier which are inserted into slits in the wall and are then twisted so as to become locked in the recess or on the opposite side of the wall.

It will be understood by those skilled in the art that various modifications and changes may be made to the present invention without departure from the scope thereof, which is defined by the appended claims.

The invention claimed is:

1. A method of providing an effective shielding or grounding of electronic equipment by securing a reliable contact between two adjacent surfaces of the electronic equipment, comprising the steps of:
providing a contact spring assembly comprising a carrier forming a plurality of recesses and a contact spring comprising a plurality of transverse elements extending between two longitudinal side portions;
mounting the carrier to a first surface of the two adjacent surfaces; and
disposing the contact spring peripherally about the carrier such that the longitudinal side portions contact the first surface and the plurality of transverse elements contact a second surface of the two adjacent surfaces;
wherein the transverse spring elements are aligned to be received into the carrier recesses, if necessary, when elastically deformed under a load produced when the two surfaces are brought into an adjacent relationship, sheltering the contact spring against overloading or permanent deformation.

2. The method of claim 1, wherein the spring element receiving recesses are formed having a width exceeding a width of the respectively associated spring elements.

3. The method of claim 1, wherein the recesses are formed having a depth exceeding the thickness of the contact spring transverse elements.

4. The method of claim 1, wherein positioning guides are formed on inner side surfaces of at least one of the recesses for providing correct positioning of the contact spring transverse element when received in the at least one recess.

5. The method of claim 1, wherein the recesses extend transversely across a first face of the carrier and around the longitudinal side edges adjacent the first carrier surface.

6. The method of claim 1, wherein the carrier is mounted by providing attachment tabs for a snap-in connection.

7. A contact spring assembly for positioning between electronic equipment components to provide a conductive interface, said contact spring assembly comprising:
an elongated contact spring carrier having on opposite sides a first face and a second face, the first face forming a plurality of pockets for receiving loaded contact spring transverse elements; and
a contact spring comprising a plurality of transverse elements extending between longitudinal side portions, the contact spring disposed about the carrier to form a first contact area adjacent to the first carrier face and a second contact area adjacent to the second carrier face, wherein each of at least a portion of the plurality of transverse elements are aligned with a pocket.

8. The assembly of claim 7, wherein the depth of the spring element receiving pockets exceeds the thickness of the aligned contact spring transverse elements such that they are fully received when sufficiently loaded.

9. The assembly of claim 7, wherein the spring element receiving pockets extend around longitudinal side edges from the first face to the second face of the carrier.

10. The assembly of claim 7, wherein the second contact areas comprises both the longitudinal side portions of the contact spring.

11. The assembly of claim 10, wherein the longitudinal side portions of the spring are each provided with contact bosses for enhancing the contact with an adjacent surface.

12. The assembly of claim 7, wherein the spring element receiving pockets have a width significantly exceeding the width of the associated spring elements.

13. The assembly of claim 12, further comprising guides extending into at least one of the pockets, the guides for positioning the contact spring transverse element when it is received in the at least one pocket.

14. The assembly of claim 7, further comprising at least one pair of attachment tabs extending from the second face of the carrier, the attachment tabs comprising free ends resiliently displaceable towards each other under pressure so as to spring back when relieved.

15. The assembly of claim 14, wherein the attachment tabs are each provided with a locking lug on their outer surface facing away from the other tab of each pair.

16. A contact spring, comprising:
a first longitudinal side portion;
a second longitudinal side portion space apart from and substantially parallel to the first longitudinal side portion; and
a plurality of spaced apart lateral spring elements extending between the first and the second longitudinal side portions;
wherein the plurality of lateral spring elements are each deformed at a first area about a first longitudinal axis in a first direction, forming a first contact area, the first contact area comprising the intersections of the lateral spring elements and the first longitudinal side portion;
wherein the plurality of lateral spring elements are each deformed at a second area in the opposite direction about a second longitudinal axis, forming a second contact area, the second contact area comprising the respective intersections of the lateral spring elements and the second longitudinal side portion; and
wherein the plurality of lateral spring elements are each further deformed at a third area, the third area disposed between the first area and the second area, about a third longitudinal axis to form a third contact area extending away from the plane of the first and second contact areas.

17. A carrier for supporting a contact spring in a contact spring assembly interposed between two electrical component surfaces, said carrier comprising:
a first elongated member forming a series of substantially rectangular apertures, the apertures being oriented transversely and extending across the entire width of the first elongated member;
a second elongated member disposed directly adjacent to the first elongated member, the first elongated member and the second elongated member being integrally formed at a common edge defining a first carrier edge; and
a third elongated member disposed directly adjacent to the first elongated member, the first elongated member and the third elongated member being integrally formed at a common edge defining a second carrier edge;
wherein the second elongated member and the third elongated member each form a series of apertures that communicate with the substantially rectangular apertures of the first elongated member at a respective one of the first and second carrier edges.

18. The carrier of claim 17, further comprising at least one pair of attachment tabs are provided a small distance apart on extending from the carrier, the tabs having free ends thereof resiliently displaceable towards each other under pressure so as to spring back when relieved.

19. The carrier of claim 18, wherein the attachment tabs are each provided with a locking lug on their outer surface facing away from the other tab of each pair.

20. The carrier of claim 17, wherein the carrier is formed from a sheet material blank.

21. A method of forming a carrier for a contact spring assembly, comprising the steps of:
providing an elongate blank of sheet material;
forming a plurality of transverse apertures in the blank, leaving respective side edge portions exterior to the plurality of apertures, and
folding each side edge portion of the blank approximately 180 degrees along a respective longitudinal folding line until the side edge portions are positioned immediately adjacent the apertures such that the blank material remaining between the apertures forms raised lands on one side of the carrier.

22. The method of claim 21, further comprising the step of folding each side edge portion approximately 180 degrees along a respective second longitudinal folding line until the peripheral portion of each side edge portion is disposed next to the respective central portion of the side edge portion.

23. The method of claim 21, further comprising the step of forming a number of tabs at regular intervals along each longitudinal side edge portion of the carrier blank.

24. The method of claim 23, further comprising the step of bending each of the tabs, along their respective second longitudinal folding line, to extend approximately normal to the carrier.

25. The method of claim 23, further comprising the steps of: forming a slit in each tab; and deforming an essentially central portion of each tab outward to form a locking lug of a generally arcuate shape.

* * * * *

UNITED STATES PATENT AND TRADEMARK OFFICE
CERTIFICATE OF CORRECTION

PATENT NO. : 7,442,880 B2
APPLICATION NO. : 10/381552
DATED : October 28, 2008
INVENTOR(S) : Nasstrom et al.

It is certified that error appears in the above-identified patent and that said Letters Patent is hereby corrected as shown below:

Title Page, Item (30), under "Foreign Application Priority Data", in Column 1, Line 1, delete "00018648" and insert -- 0001864-8 --, therefor.

In Column 1, Line 8, delete "components" and insert -- components, --, therefor.

In Column 1, Line 45, delete "spring" and insert -- springs --, therefor.

In Column 2, Line 38, after "invention is to" insert -- provide a solution to --.

In Column 3, Line 40, after "to a surface" insert -- of --.

In Column 4, Line 63, delete "purpose" and insert -- purposes --, therefor.

In Column 6, Line 21, after "assembled" insert -- by --.

Figures 6A, 6B, 6C:
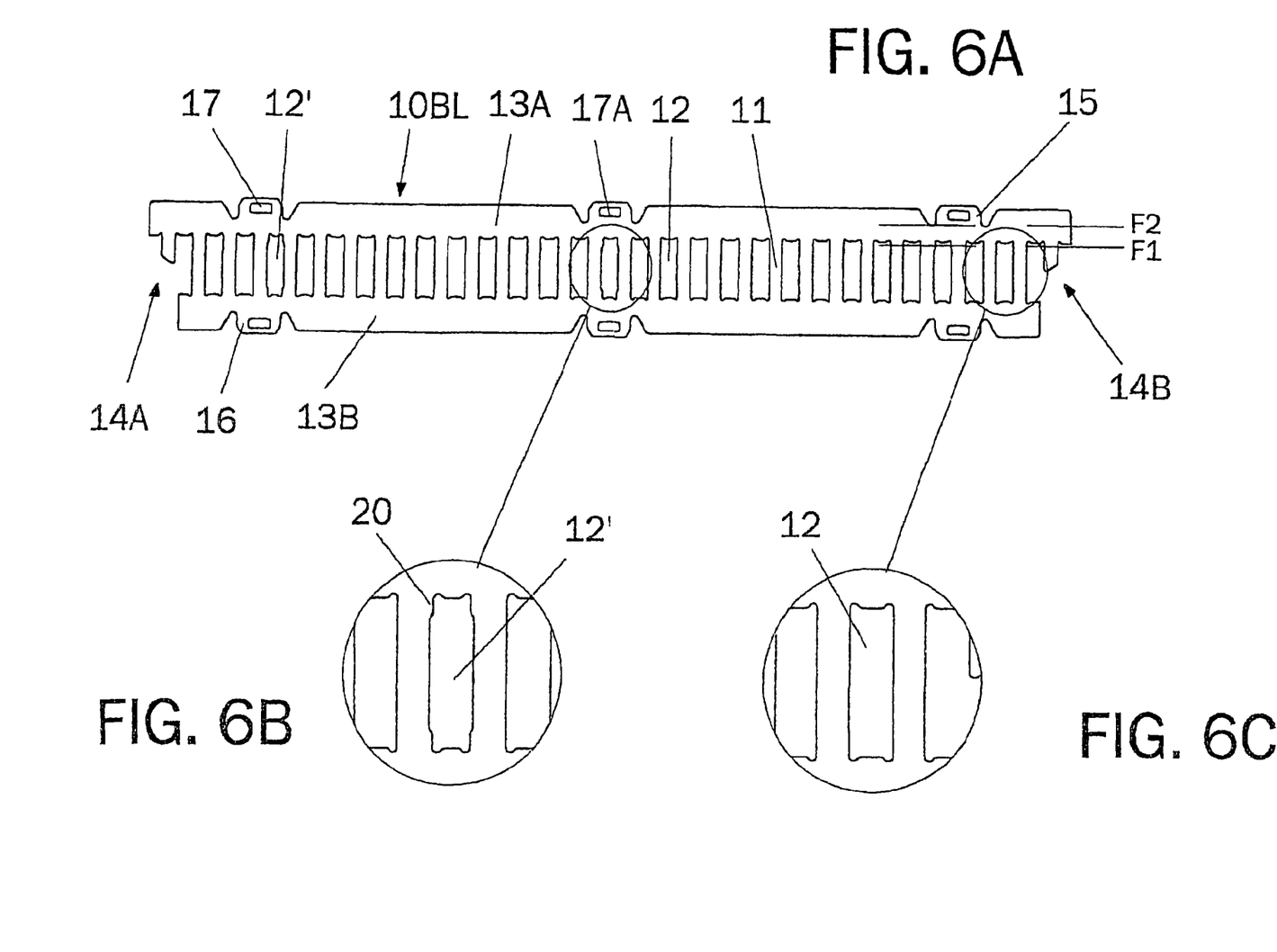
FIG. 6A is a top plan view of an embodiment of a carrier blank for forming a carrier of the contact spring assembly according to the invention.
FIGS. 6B-C illustrate details of the carrier blank of FIG. 6A.

In Column 6, Line 40, delete "FIG. 6B" and insert -- FIG. 6B) --, therefor.

In Column 7, Line 5, after "fall down" delete "to" and insert -- on --, therefor.

In Column 7, Line 46, delete "from" and insert -- form --, therefor.

In Column 7, Line 59, delete "metal" and insert -- material --, therefor.

In Column 7, Line 64, delete "bland" and insert -- blank --, therefor.

In Column 7, Line 67, delete "bland" and insert -- blank --, therefor.

In Column 8, Line 38, delete "part" and insert -- parts --, therefor.

UNITED STATES PATENT AND TRADEMARK OFFICE
CERTIFICATE OF CORRECTION

PATENT NO.       : 7,442,880 B2
APPLICATION NO.  : 10/381552
DATED            : October 28, 2008
INVENTOR(S)      : Nasstrom et al.

It is certified that error appears in the above-identified patent and that said Letters Patent is hereby corrected as shown below:

In Column 10, Line 27, in Claim 16, delete "space" and insert -- spaced --, therefor.

Signed and Sealed this

Twenty-first Day of April, 2009

JOHN DOLL
*Acting Director of the United States Patent and Trademark Office*